US010847508B2

(12) United States Patent
Ishihara

(10) Patent No.: US 10,847,508 B2
(45) Date of Patent: Nov. 24, 2020

(54) APPARATUS WITH A CURRENT-GAIN LAYOUT

(71) Applicant: Micron Technology, Inc., Boise, ID (US)

(72) Inventor: Takashi Ishihara, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/234,358

(22) Filed: Dec. 27, 2018

(65) Prior Publication Data

US 2020/0212029 A1 Jul. 2, 2020

(51) Int. Cl.
*H01L 27/02* (2006.01)
*G11C 11/4093* (2006.01)
*H01L 27/108* (2006.01)

(52) U.S. Cl.
CPC ...... *H01L 27/0207* (2013.01); *G11C 11/4093* (2013.01); *H01L 27/10897* (2013.01)

(58) Field of Classification Search
CPC ........... H01L 27/0207; H01L 27/10897; H01L 27/108; H01L 2924/1436; G11C 11/4093; G06F 2213/16; G09G 2300/0852
See application file for complete search history.

(56) References Cited

U.S. PATENT DOCUMENTS

| 4,985,738 A | 1/1991 | Nishizawa et al. |
| 2001/0043493 A1* | 11/2001 | Fujioka ............ G11C 11/40615 365/189.09 |
| 2004/0178453 A1 | 9/2004 | Duvvury et al. |
| 2005/0287718 A1 | 12/2005 | Berndlmaier et al. |
| 2007/0231979 A1* | 10/2007 | Chidambarrao .... H01L 29/7846 438/154 |
| 2012/0299097 A1 | 11/2012 | Bulucea |
| 2012/0313177 A1* | 12/2012 | Chen .................. H01L 27/1104 257/368 |
| 2015/0035070 A1* | 2/2015 | Chiang ................ H01L 27/092 257/369 |
| 2018/0269229 A1 | 9/2018 | Or-Bach et al. |
| 2018/0323215 A1* | 11/2018 | Chong ................. G06F 30/392 |

FOREIGN PATENT DOCUMENTS

JP 2017130692 A 7/2017

OTHER PUBLICATIONS

International Application No. PCT/US2019/045054—International Search Report and Written Opinion, dated Nov. 22, 2019, 11 pages.
TW Patent Application No. 108129860—Taiwanese Office Action and Search Report, dated Mar. 23, 2020, with English Translation, 9 pages.

* cited by examiner

*Primary Examiner* — Galina G Yushina
(74) *Attorney, Agent, or Firm* — Perkins Coie LLP

(57) ABSTRACT

An apparatus includes: a first substrate comprising a first current channel that includes a first plurality of doped regions on the first substrate; a second substrate comprising a second current channel that includes a second plurality of doped regions in the second substrate, wherein: the doped regions of the second substrate are physically separate from those of the first substrate, and the second current channel is aligned colinearly with the first current channel; and a conductive structure extending across the first substrate and the second substrate and electrically connecting matching doped regions of the first current channel and the second current channel.

19 Claims, 7 Drawing Sheets

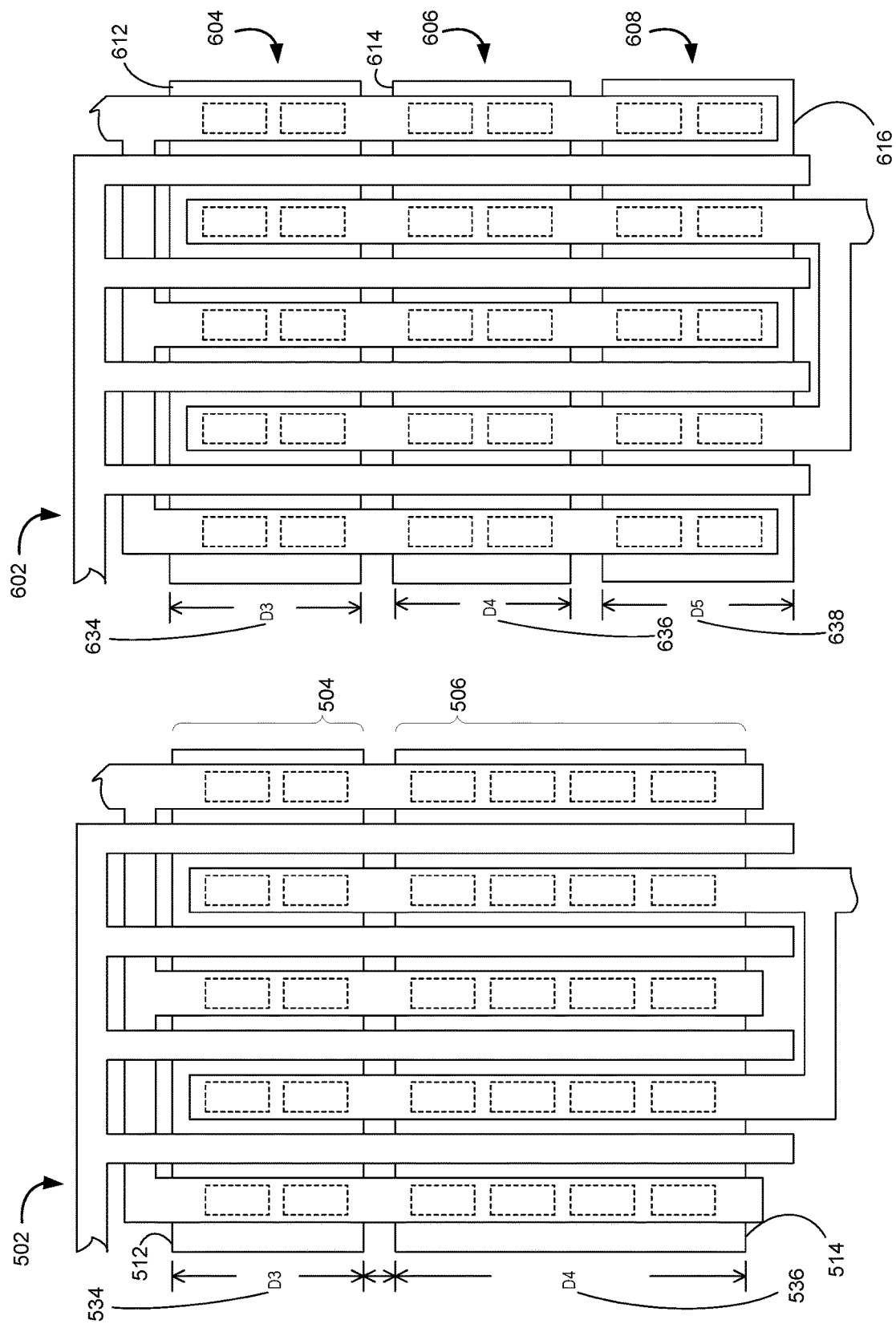

US 10,847,508 B2

APPARATUS WITH A CURRENT-GAIN LAYOUT

TECHNICAL FIELD

The disclosed embodiments relate to devices, and, in particular, to semiconductor devices with a current-gain layout.

BACKGROUND

Semiconductor devices (e.g., transistor devices) can include semiconductor circuits configured to switch electronic signals. The transistor devices can include at least three terminals (e.g., gate, source, and drain) that connect to external circuits. To operate the transistor devices, voltage is controlled across a pair of the terminals, which controls the current through another pair of terminals. Accordingly, the transistor devices can operate in a first state that enables current flow across the terminals and a second state that restricts the current flow. For example, in transistor devices, electric current from the source terminal to the drain terminal can be restricted when a voltage, that is lower than a threshold voltage, is applied between the gate and source terminals.

The transistor devices can be configured to provide a targeted amount of current (e.g., drain-source current ($I_{DS}$) through the corresponding terminals (e.g., drain and source). For example, a layout, a total number of channels, a size of the channel, etc. of the transistor devices can be controlled to provide the targeted amount of current.

FIG. 1A is a plan view of a first transistor unit 102. The first transistor unit 102 can be a base unit of circuit (e.g., a single transistor and/or current channel) that can be used to design a semiconductor device. The first transistor unit 102 can include a substrate 112 (e.g., semiconductive material, such as silicon, germanium, etc.) that serves as a diffusion area or active area for the electrons.

The first transistor unit 102 can include a gate 122 attached to the substrate 112 between a source 124 and a drain 126. The gate 122 can be the terminal or the electrical connection that supplies the control voltage (e.g., a specific voltage relative to the source 124) that regulates the operating state of the first transistor unit 102. According to the gate voltage, the drain-source current can flow between the drain 126 and the source 124. For transferring the current in and out of the circuit, the first transistor unit 102 can include conductive structures (e.g., a terminal pad, a trace, etc.) that form and/or connect to the drain 126 and the source 124, such as at contact regions 116.

The first transistor unit 102 can further have a size or a dimension that influences the amount of drain-source current. For example, the first transistor unit 102 can correspond to a first width 132 (D1) that is orthogonal to a current flow direction 134 that goes across the gate 122 between the source 124 and the drain 122. The first width 132 can represent a size of the current corridor or a number of electrons that can simultaneously travel across the source 124 and the drain 122. Accordingly, the width of the transistor can be a parameter that influences its drain-source current capacity.

FIG. 1B is a plan view of a first transistor device 152 that includes the first transistor unit 102 as a base circuit. For example, the first transistor device 152 can include multiple instances of the first transistor unit 102 combined along the current flow direction 134 to form a single transistor device having the first width 132. Accordingly, the first transistor device 152 can include multiple current channels, which provides increased drain-source current for a given width (e.g., the first width 132). The number of current channels in the transistor device can be a further parameter that influences its drain-source current capacity.

As illustrated in FIG. 1B, the first transistor device 152 can include four overlapping instances of the first transistor unit 102. Accordingly, the first transistor device 152 can include four current channels. The gate 122 can extend between each of the source-drain combination. Each current channel (e.g., an adjacent pair of a source and a drain with the gate therebetween) can produce its own source-drain current. The contacts for the source 124 can be tied together (e.g., via a conductive structure, such as a trace or a pad) to form a single terminal for the source 124, and the contacts for the drain 126 can be tied together to form a single terminal for the drain 126. Accordingly, the source-drain current of each current channel can be combined to provide a total source-drain current for the first transistor device 152.

For illustrative purposes, the first transistor unit 102 and the transistor device 152 are shown with six contacts per each drain and source. Also for illustrative purposes, the first transistor device 152 is shown having four current channels. However, it is understood that the first transistor unit 102 and the transistor device 152 can have any number of contacts and/or current channels.

FIG. 2A illustrates a second transistor unit 202. As an alternative to the first transistor 102 of FIG. 1A, the second transistor unit 202 can be a base unit of circuit that can be used to design a semiconductor device. The second transistor unit 202 can include a first sub-unit 204 and a second sub-unit 206, both of which are the same current channel as each other (e.g., N– channel or P– channel). The first sub-unit 204 and the second sub-unit 206 can each include its own set of a gate 222, a source 224, and a drain 226 on its own section of the substrate. For example, the first sub-unit 204 can include a first substrate section 212 that is doped to form the source 224 and the drain 226 on opposing sides of the gate 222. The second sub-unit 206 can include a second substrate section 214 that is doped to form the source 224 and the drain 226 on opposing sides of the gate 222. Conductive structures can be connected to control the voltage at their gates and send/receive currents from the sources and the drains.

The first sub-unit 204 and the second sub-unit 206 can both have a second width 232 (D2) along a direction orthogonal to a current flow direction 234. For comparison, the second width 232 can be half of the first width 132 of FIG. 1, such that the combined width of the second transistor unit 202 is the same as the first transistor unit 102. For discussion purposes, the first width 132 will be assumed to be 2 μm and the second width 232 will be assumed to be 1 μm for the following descriptions; both the first transistor unit 102 and the second transistor unit 202 can have a total width of 2 μm. However, it is understood that the transistor widths can be any size.

While the total width may be identical (along with other characteristics, such as contact size/spacing, substrate characteristics, biasing characteristics, etc.) across the first transistor unit 102 and the second transistor unit 202 (i.e., when the sub-units 204 and 206 are electrically connected), the second transistor unit 202 can provide increased source-drain current based on the additional current channel therein. In other words, the second transistor unit 202 can be larger in current gain than the first transistor unit 202.

FIG. 2B illustrates a second transistor device 252 that includes the second transistor unit 202 as a base circuit. For example, the second transistor device 252 can include multiple instances of the second transistor unit 202 combined along the current flow direction 234 to form a single transistor device having the second width 232. Accordingly, the second transistor device 252 can include multiple current channels, which provides increased drain-source current for a given width (e.g., the second width 232). As illustrated in FIG. 2B, the second transistor device 252 include four overlapping instances of the second transistor unit 202. Accordingly, the second transistor device 252 can include eight current channels across a common substrate.

In comparing the first transistor device 152 of FIG. 1B with the second transistor device 252, the second transistor device 252 can have the same total width (e.g., based on having half of the unit width and double the number of current channels) as the first transistor device 152. Similar to the corresponding transistor units, the second transistor device 252 can have greater drain-source current than the first transistor device 152 due to the larger number of current channels in the second transistor device 252. In other words, as the width of the current channels increases, such as for the first transistor device 152, threshold voltage becomes smaller the drain-source current decreases. However, increasing the number of current channels in a device, such as for the second transistor device 252, the power consumption increases. The increase in the number of current channels causes increase in the interconnection (e.g., the conductive structure that connects all of the sources and all of the drains, etc.), which further increases parasitic capacitance. Accordingly, the second transistor device 252 consumes more power than the first transistor device 152.

BRIEF DESCRIPTION OF THE DRAWINGS

FIG. 5 is a plan view of an apparatus in accordance with an embodiment of the present technology.

FIG. 6 is a plan view of an apparatus in accordance with an embodiment of the present technology.

DETAILED DESCRIPTION

As described in greater detail below, the technology disclosed herein relates to semiconductor devices, systems with semiconductor devices, and related methods for providing a current-gain layout in the semiconductor devices. In the embodiments described below, the semiconductor devices (e.g., transistors) can include sectional transistor devices that have at least two separate sections (e.g., substrates) that are tied by continuous and/or straight conductive structures for its gate, source, and drain regions. In other words, the sectional transistor devices can include two or more current channels or transistor units connected in series.

Figure 3:
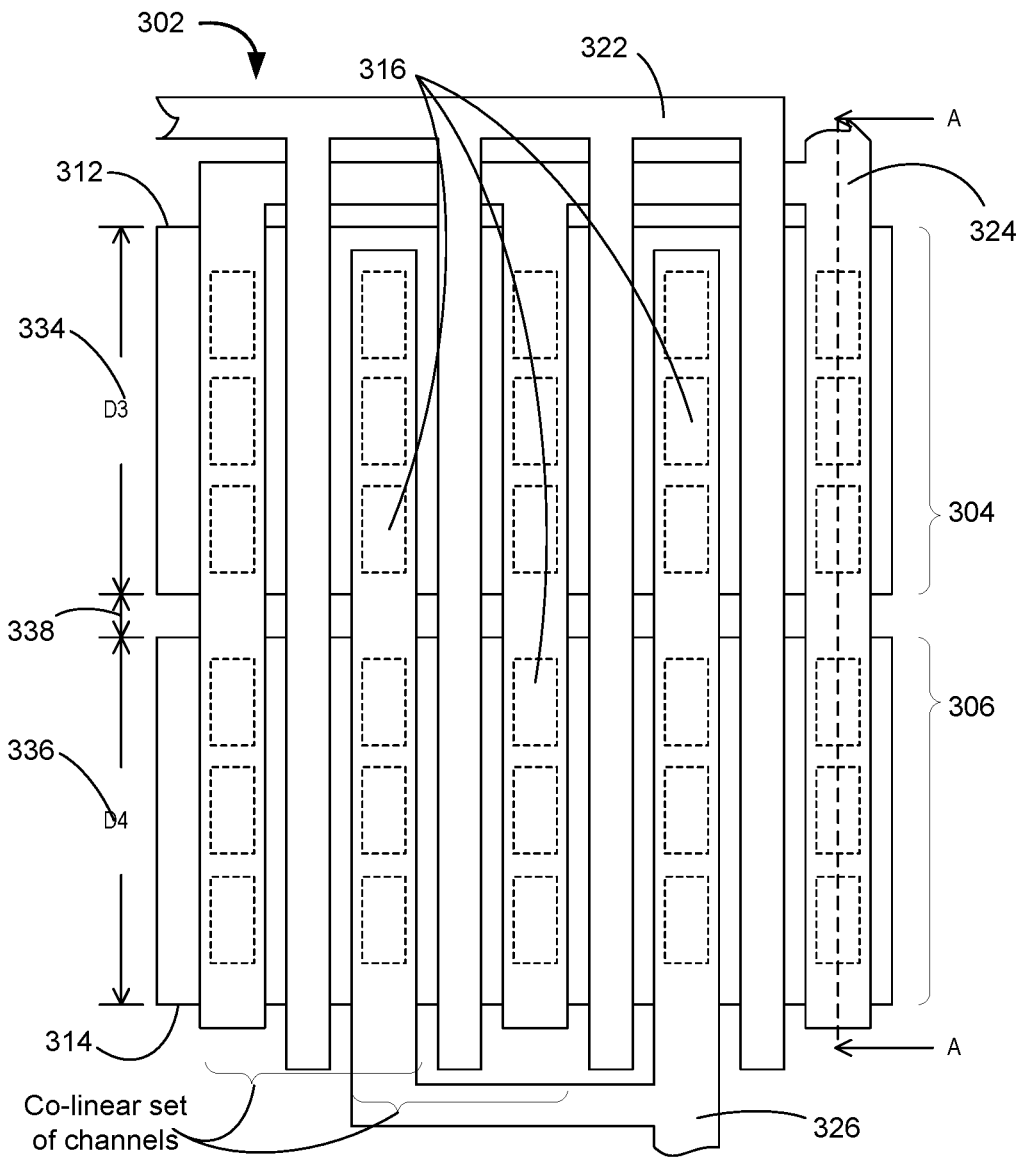
FIG. 3 is a plan view of an apparatus in accordance with an embodiment of the present technology.

FIG. 3 is a plan view of an apparatus (e.g., a sectional transistor device 302) in accordance with an embodiment of the present technology. The sectional transistor device 302 can include a first section 304 and a second section 306. The first section 304 and the second section 306 can each include one or more current channels (e.g., individual transistor units). In some embodiments, the first section 304 and the second section 306 can include a same number of current channels.

The first section 304 can include a first substrate (or active region) 312 and the second section 306 can include a second substrate (or active region) 314 that are separate (e.g., non-contiguous bodies of semiconductive material) from each other. In some embodiments, the sectional transistor device 302 can include a shallow trench isolation (STI) between the first section 304 and the second section 306 that separates the two sections. The first substrate 312 and the second substrate 314 can each include regions that are doped to form sources and drains. The sectional transistor device 302 can include conductive structures (e.g., wires, traces, pads, etc.) that connect to the doped regions. For example, a gate connector 322 (e.g., a conductive structure having multiple legs/extensions) can be connected to the gates between each pairing of source and drain. Also, at various contacts 316, a source connector 324 can directly contact the source regions of the substrates and a drain connector 326 can directly contact the drain regions of the substrates.

Also, the first section 304 and the second section 306 can each include current channels that are arranged parallel to each other, such as in rows or columns. The first section 304 can include current channels that have a first section width 334 (D3), and the second section 306 can include current channels that have a second section width 336 (D4). Further, the first section 304 and the second section 306 can be separated by a separation distance 338 such as STI.

In some embodiments, the first section 304 and the second section 306 can be arranged such that the current channels of the first section 304 extend along a first line and the current channels of the second section 306 extend along a second line. For example, for the embodiment illustrated in FIG. 3, the first section 304 can be located ahead (e.g., on top as illustrated in FIG. 3) of the second section 306, and the sources, gates, drains of the first section 304 can be aligned with those of the second section 306. Accordingly, the gate connector 322, the source connector 324, and the drain connector 326 can include parallel legs that extend across (e.g., along the first section width 334 and the second section width 336) both the first substrate 312 and the second substrate 314 and over the separation 338 between the two sections. As such, each of the connector legs can connect the corresponding components (e.g., gate, source, or drain) of a current channel for both sections. As a result, the current channels on the first substrate 312 can be connected electrically with the current channels on the second substrate 314.

Figure 1B:
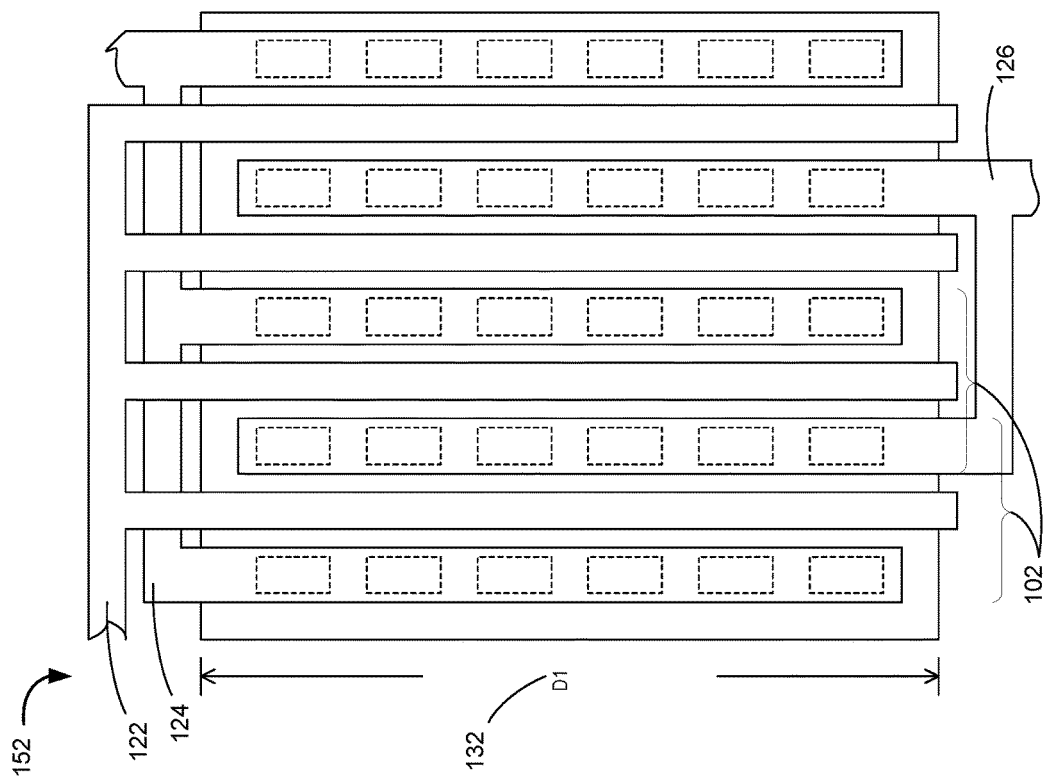
FIG. 1B is a plan view of a first transistor device that includes the first transistor unit as a base circuit.
Figure 1A:
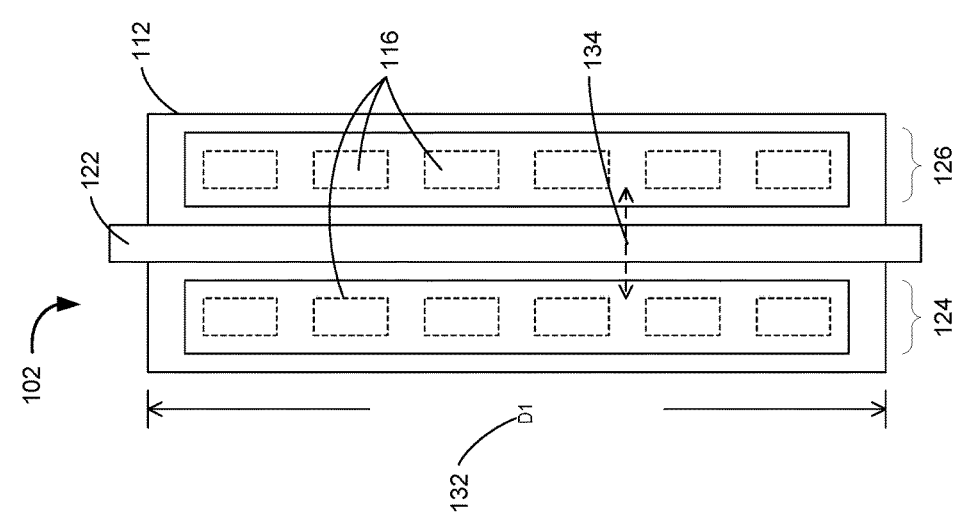
FIG. 1A is a plan view of a first transistor unit.
Figure 2A:
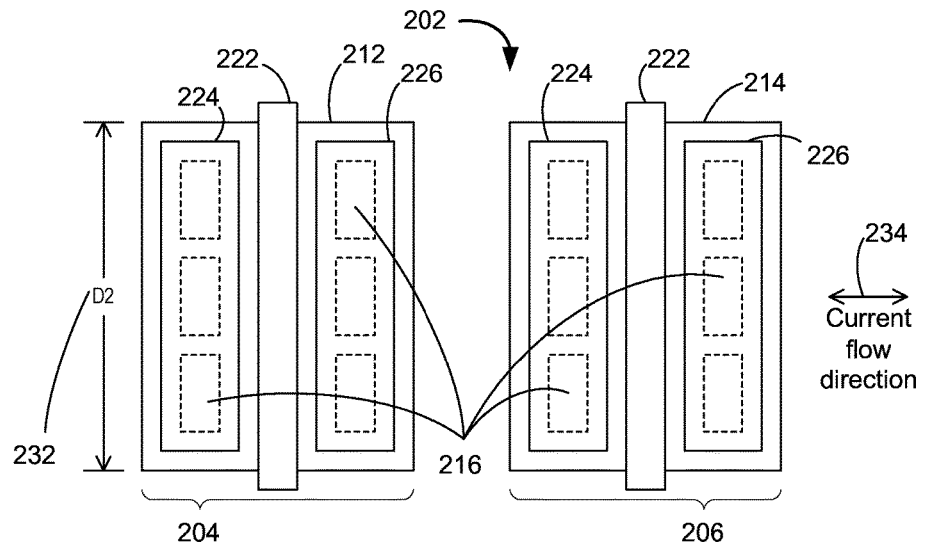
FIG. 2A is a plan view of a second transistor unit.
Figure 2B:
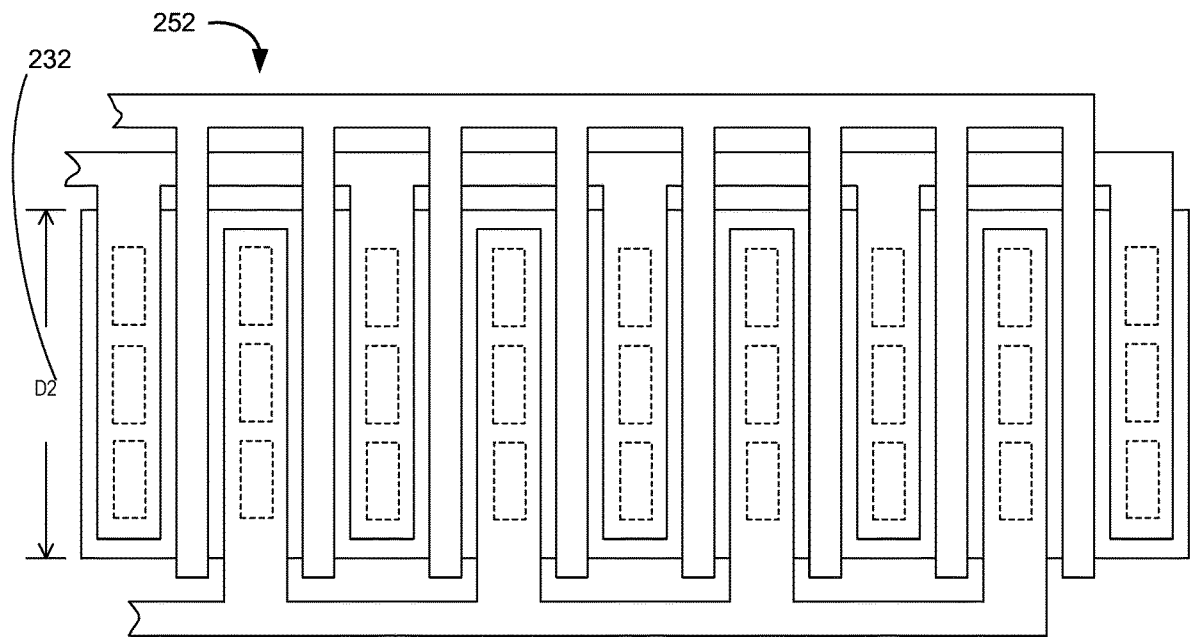
FIG. 2B is a plan view of a second transistor device that includes the second transistor unit as a base circuit.

Based on connecting a set of current channels, the sectional transistor device 302 can provide the increased number of current channels without the increasing the interconnects. For comparison to the first transistor device 152 of FIG. 1B and the second transistor device 252 of FIG. 2B, the first section width 334 and the second section width 336 can be the same as the second width 232 of FIG. 2A, which is half of the first width 132 of FIG. 1A (i.e., $D_3=D_4=D_2=\frac{1}{2}$ $D_1$). Also, the sectional transistor device 302 can have the same number of total current channels (e.g., eight current channels) as the second transistor device 252. Based on connecting a set of current channels, the sectional transistor device 302 can have a total number (e.g., four) of current channels as the total number of current channels in the first transistor device 152. Accordingly, the sectional transistor device 302 can have the same total width for the set of current channels as the channel width of the first transistor device 152 and matching number of connector legs. As such, the sectional transistor device 302 can provide increased drain-source current (e.g., in comparison to the first transistor device 152) with reduced parasitic interconnection capacitance (e.g., in comparison to the second transistor device 252). The higher operating speed and the reduced parasitic interconnection capacitance (e.g., based on reduced number of connector legs), allows the sectional transistor device 302 to operate at higher speeds than the first transistor device 152 and the second transistor device 252. Alternatively, the sectional transistor device 302 can provide the same source-drain current with reduced size (e.g., reduced total width of the device) in comparison to the layouts illustrated in FIGS. 1A-2B.

Figure 4:
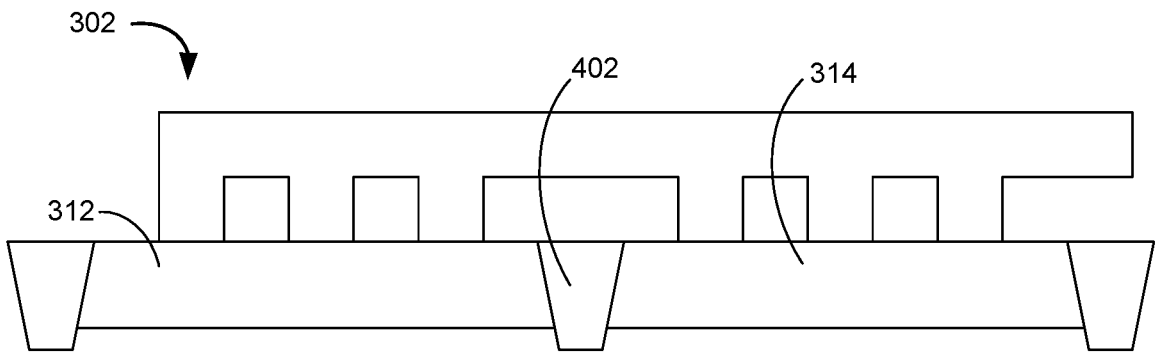
FIG. 4 is a cross-sectional view along a line A-A in FIG. 3 of the apparatus in accordance with an embodiment of the present technology.

FIG. 4 is a cross-sectional view along a line A-A in FIG. 3 of the apparatus (e.g., the sectional transistor device 302) in accordance with an embodiment of the present technology. The diffusion regions (e.g., the first substrate 312, the second substrate 314, etc.) of the sectional transistor device 302 can be separated from each other by an isolation mechanism 402 (e.g., STI). In some embodiments, one or more additional isolation mechanism (e.g., additional STIs) can be formed on opposing ends of the first substrate 312 and/or the second substrate 314. The isolation mechanism 402 can have a dimension (e.g., a width on top of the STI) that provides the separation distance 338 of FIG. 3. In some embodiments, the diffusion regions can be completely separated from each other.

FIG. 5 is a plan view of an apparatus (e.g. a sectional transistor device 502) in accordance with an embodiment of the present technology. In some embodiments, the apparatus can have separate diffusion regions that have different widths. For example, the sectional transistor device 502 can include a first section 504, a second section 506, etc. The first section 504 can have a first substrate 512 (e.g., one of the diffusion regions) and the second section 506 (e.g., a separate diffusion region) can have a second substrate 514. The first substrate 512 can correspond to a first section width 534 ($D_3$) and the second substrate 514 can correspond to a second section width 536 ($D_4$). The first section width 534 can be different (e.g., greater or lesser) than the second section width 536 (i.e., such that $D_3<D_4$ or $D_3>D_4$).

Since the total channel width of the current channels in the col-linear set affects the drain-source current, the difference in the first section width 534 and the second section width 536 does not affect the drain-source current. For comparison, in order to match the 2 μm channel width of the first transistor unit 102 of FIG. 1A and/or the second transistor unit 202 of FIG. 2A, the first section width 534 can be 0.66 μm and the second section width 536 can be 1.34 μm in some embodiments.

FIG. 6 is a plan view of an apparatus (e.g. a sectional transistor device 602) in accordance with an embodiment of the present technology. The apparatus can have any number of separate diffusion regions, such as two, three, or more diffusion regions. For example, the sectional transistor device 602 can include a first section 604, a second section 606, a third section 608. etc. the first section 604 can have a first substrate 612, the second section 606 can have a second substrate 614, the third section 608 can have a third substrate 616, etc. Each of the diffusion regions can have a width, such that the first substrate 612 can correspond to a first section width 634 ($D_3$), the second substrate 614 can correspond to a second section width 636 ($D_4$), and/or the third substrate 616 can correspond to a third section width 638 ($D_5$). As discussed above, in some embodiments, one or more of the widths can be the same. In some embodiments, one or more of the widths can be unique and different from each other.

Figure 7:
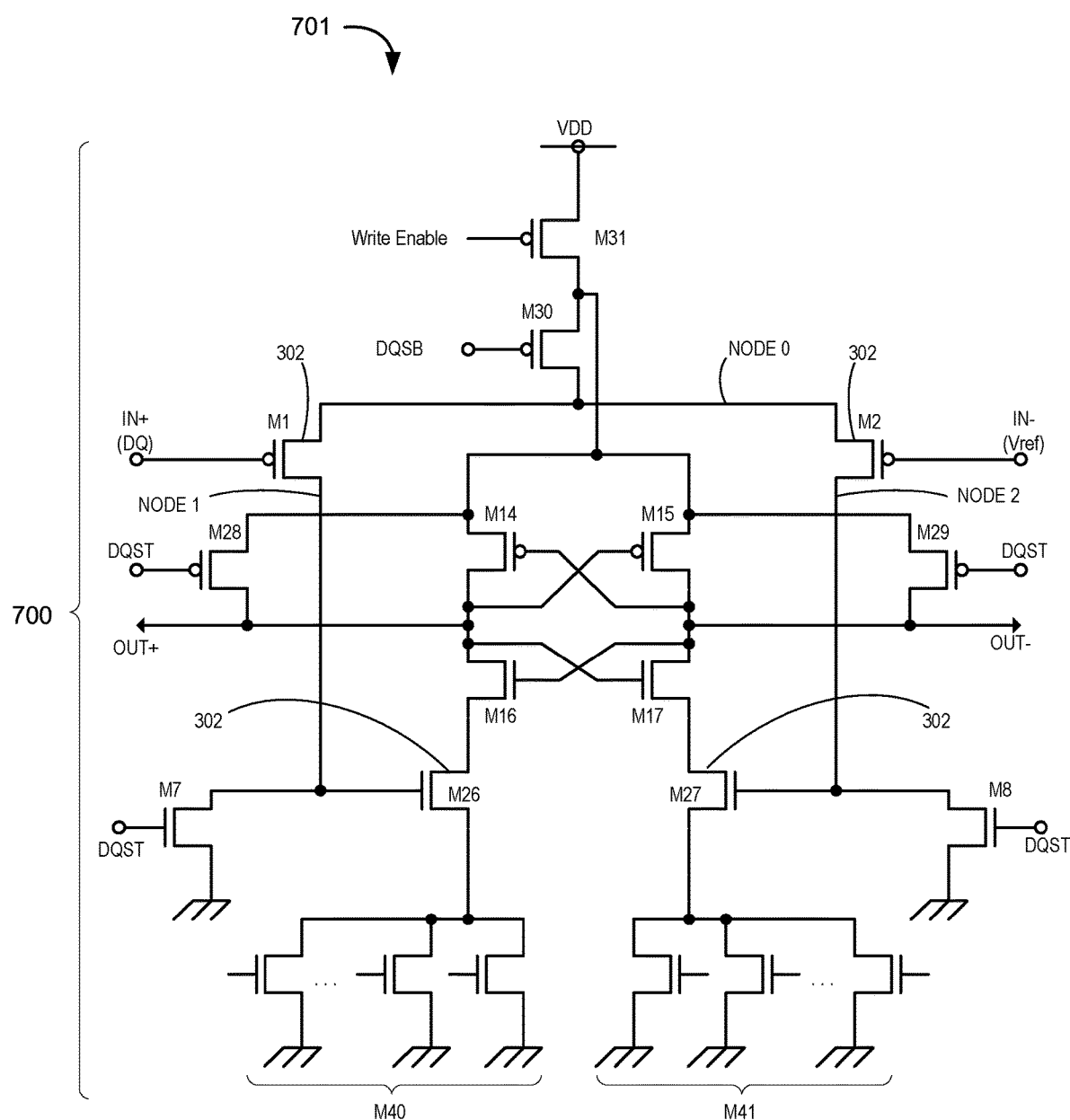
FIG. 7 is an example circuit diagram of an input buffer in accordance with an embodiment of the present technology.

In some embodiments, the input buffer 700 can be employed at a data (DQ) connection in a memory device (e.g., a dynamic random-access memory (DRAM) 701). FIG. 7 is an example circuit diagram of an input buffer 700 in accordance with an embodiment of the present technology. In some embodiments, the input buffer 700 including the sectional transistor device 302 at one or more portions therein can be implemented for a memory device (e.g., a dynamic random-access memory (DRAM) device). For example, the input buffer 700 can be included in one or more data terminal (DQ) connections (e.g., within input buffers) that are configured to receive a data (DQ) signal to be written into a memory location.

The input buffer 700 can include one or more transistors (e.g., N-channel transistors and/or P-channel transistors) configured to receive and process corresponding input signals such as a write enable signal, a DQ system signal (e.g., DQSB, DQST, etc.), the data (DQ) signal, or a combination thereof. In some embodiments, the DQ system signal can include the DQSB signal corresponding to a bar signal of a data strobe signal (DQS), the DQST corresponding to a true signal of DQS, or a combination thereof. Accordingly, the input buffer 700 can generate an output signal based on receiving and processing the input signals.

In some embodiments, the input buffer 700 can include a P-channel transistor (M31) controlled by the write enable signal (e.g., supplied to a gate of M31) to connect a supply voltage (VDD; e.g., connected to a source of M31) to the other transistors. For example, M31 can be OFF when the write enable signal is at an inactive high level, such as when no data signal to be written is supplied to the input buffer 700, thereby reducing a leakage current. A source of another P-channel transistor (M30; controlled by the DQSB supplied to a gate thereof) can be connected to a drain of M31. A drain of M30 can be connected to sources of one or more further P-channel transistors (M1 and/or M2) operated by the DQ signal connected to gates thereof. In one or more embodiments, M1 and/or M2 can be a differential amplifier or a portion thereof such that the gate of M1 is connected to a positive connection of the DQ signal and M2 is connected to a negative connection of the DQ signal (e.g. a reference node (Vref)). Drains of M1 and/or M2 can be connected to ground through corresponding precharging transistors (e.g., N-channel transistors M7 and M8, respectively) that are operated by the DQST signal connected to the gates of the M7 and/or M8. The precharging transistors (M7, M8, M30, M27, M28, M29, or a combination thereof) can be operated according to a data strobe signal (DQS) or derivatives thereof (e.g., the DQST and/or the DQSB signals) to precharge the respective nodes.

In some embodiments, the drains of M1 and/or M2 can further be connected to gates of corresponding N-channel transistors (M26 and M27, respectively) for further amplifying an output of the differential amplifier (e.g., M1 and M2). Sources and drains of the amplifying transistors (M26 and/or M27) can be connected to a series of transistors connected to a source of M31 and a drain of M30. For example, the sources of the amplifying transistors M26 and/or M27 can be connected to ground through one or more current control transistors (e.g., N-channel transistors M40 and/or M41). Also, the drains of the amplifying transistors M26 and/or M27 can be connected to one or more latching transistors (e.g., M14, M15, M16, and/or M17 for holding logic level amplified by M1, M2, M26, and/or M27) and/or one or more precharging transistors (e.g., M28 and/or M29). In some embodiments, sources of the latching transistors and/or the precharging transistors (e.g., M14, M15, M28, and/or M29) can be connected to the drain of M31 and the source of M30. Drains of the upstream output transistors can generate the output signal. For example, the drains of M28 and M14 can generate a differential high portion of the output signal (OUT+) and the drains of M29 and M15 can generate a differential negative portion of the output signal (OUT−). One or more of the upstream output transistors (e.g., M14 and/or M15) can be operated according to the opposing differential output connected to the gates thereof. For example, the gate of M14 can be connected to OUT− and/or the gate of M15 can be connected to OUT+. Some of the other upstream output transistors (e.g., M28 and/or M29) can be operated according to the DQST signal connected to the gates thereof. In some embodiments, the nodes that corresponding to OUT+ and/or OUT− can be further connected to one or more downstream transistors (e.g., N-channel transistors M16 and/or M17). For example, drain of M16 can be connected to the OUT+ node, and drain of M17 can be connected to the OUT− node. Also, source of M16 can be connected to drain of M26, and source of M17 can be connected to drain of M27. The gates of the downstream transistors can be operated by the opposing differential output, such as by having gate of M16 connected to the OUT− node and by having gate of M17 connected to the OUT+ node.

The input buffer 700 can include the sectional transistor device 302 for one or more of the transistors described above. For example, the sectional transistor device 302 can be used at one or more locations in the DQ input buffer, such as for amplifying the logic level (e.g., increasing a gain to operate at a high speed). In one or more embodiments, the sectional transistor device 302 can be used to initially receive the DQ signal, such as for the P-channel transistors M1 and/or M2 where the DQ signal is connected to the gate connector 322). In one or more embodiments, one or more sets of the sectional transistor device 302 can be implemented in the DQ input buffer as differential amplifiers (e.g., M1 and/or M2), second stage amplifier (e.g., M26 and M27), etc.

Figure 8:
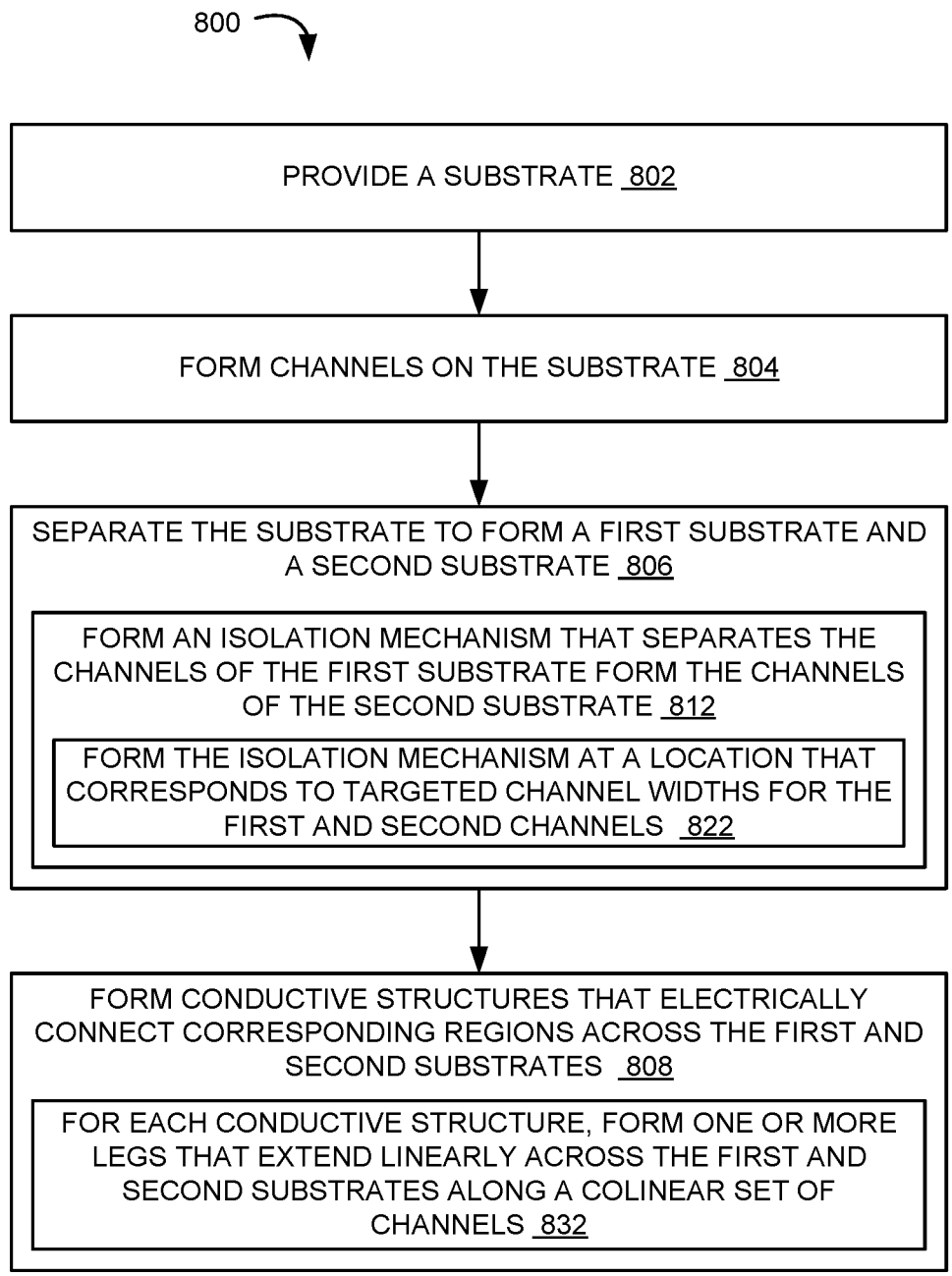
FIG. 8 is a flow diagram illustrating an example method of manufacturing an apparatus in accordance with an embodiment of the present technology.

FIG. 8 is a flow diagram illustrating an example method 800 of manufacturing an apparatus in accordance with an embodiment of the present technology. for example, the method 800 can be for manufacturing the sectional transistor device 302 of FIG. 3, the sectional transistor device 502 of FIG. 5, the sectional transistor device 602 of FIG. 6 or a portion thereof, etc.

At block 802, a semiconductor substrate (e.g., silicon, germanium, etc.) can be provided. At block 804, various regions of the semiconductor substrate can be doped to form one or more current channels. For example, different regions of the semiconductor substrate can be doped using acceptors or p-type dopants (e.g., boron, aluminum, gallium, etc.), donors or n-type dopants (e.g., phosphorous, arsenic, lithium, etc.), or other dopants. Also, the various regions can be doped to form doped substrate, wells, depletion layer, and/or other doped regions that correspond to the source, the gate, the drain, etc. The various regions (e.g., the source regions, the gate regions, the drain regions, etc.) can be formed extending along a common direction such that the resulting current channels are parallel to each other. For example, the substrate can be doped to form alternating columns/rows of source and drain with a gate region between abutting a pair of sour-drain or drain-source.

At block 806, the semiconductor substrate can be separated to form a targeted number of separate substrates that include at least a first substrate (e.g., the first substrate 312 of FIG. 3) and a second substrate (e.g., the second substrate 314 of FIG. 3). In some embodiments, such as represented at block 812, the substrate can be separated based on forming an isolation mechanism (e.g., STI) that extends across the current channels (e.g., perpendicular to the channel width), and thus electrically and/or physically separating the current channels into the divided sections. For example, the isolation mechanism can be formed based on forming a trench (e.g., via masking and dry or wet etching) and filling the trench with an insulator (e.g., an oxide). Since existing linear current channels are divided into sections, the current channels on the divided substrates can be parallel with each other.

In some embodiments, such as represented at block 822, the isolation mechanism can be formed at a location that corresponds to targeted channel widths (e.g., the first channel width, the second channel width, the third channel width, etc.) for the first and second current channels. Further, the isolation mechanism can be formed having a dimension that corresponds to the separation distance 338 of FIG. 3. A targeted total channel width for the sectional transistor device can be based on (e.g., the sum of) the targeted channels widths of the divided substrates.

At block 808, one or more conductive structures can be formed to electrically connect matching or corresponding regions across the first and second substrates. For example, a gate connector (e.g., a trace, a contact, a pad, etc.) can be formed (e.g., via depositing conductive metal) connecting a set or all of the gate regions on the divided substrates. Similarly, a source connector and a drain connector can be formed connecting the source regions and the drain regions, respectively. Forming each of the connectors can include forming one or more legs that each correspond to a current channel, such as illustrated at block 832. Each of the legs can be formed extending along a direction (e.g., a direction parallel to the channel width) across the divided sections and the isolation mechanism. For example, each of the legs can be directly over and extend along the corresponding regions of a set of current channels.

The method 800 is illustrated using some of the processing steps in an example order. However, one of ordinary skill in the art can appreciate that the method 800 includes other associated steps (e.g., masking, planarization, etc.) associated with semiconductor processing. Further, in some embodiments, the method of manufacture can be different. For example, the various substrates can be separately provided, processed (e.g., doped) and then attached to opposing sides of the isolation mechanism such that the current channels are parallel.

Figure 9:
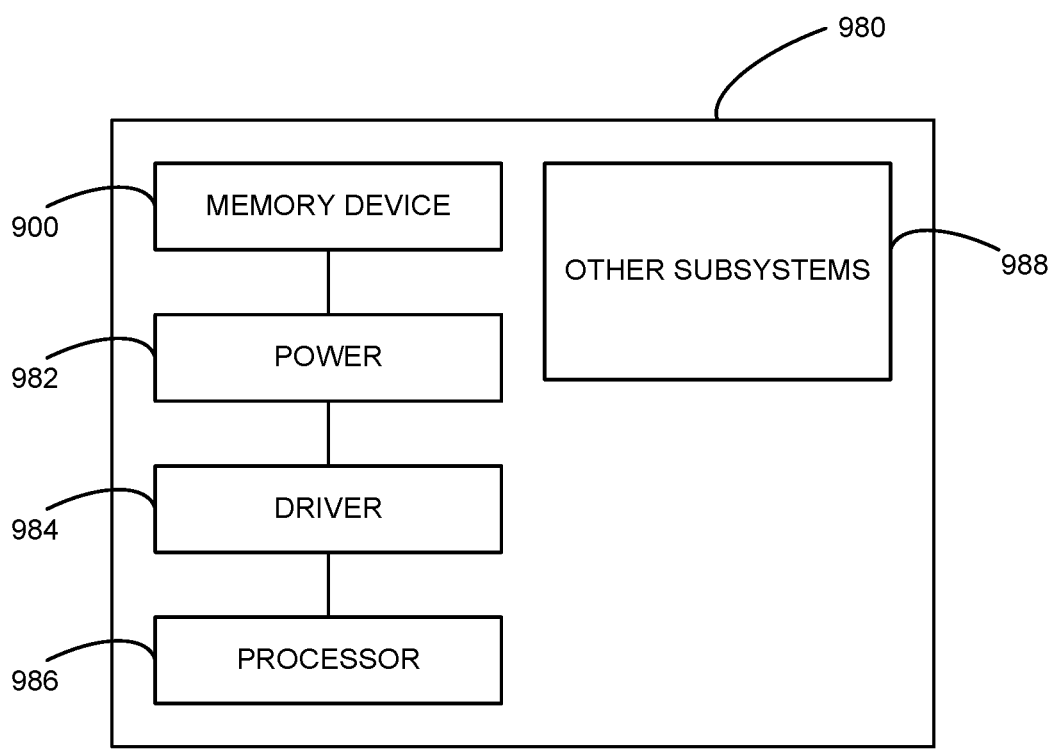
FIG. 9 is a schematic view of a system that includes a memory device in accordance with an embodiment of the present technology.

FIG. 9 is a schematic view of a system that includes the apparatus (e.g., the sectional transistor device described above) in accordance with embodiments of the present technology. Any one of the foregoing embodiments described above with reference to FIGS. 3-8 can be incorporated into any of a myriad of larger and/or more complex systems, a representative example of which is system 980 shown schematically in FIG. 9. The system 980 can include a memory device 900, a power source 982, a driver 984, a processor 986, and/or other subsystems or components 988. The system 980 can include devices/transistors having features generally similar to those of the sectional transistor devices described above with reference to FIGS. 3-8, and can therefore include various features for performing a direct read request from a host device. The resulting system 980 can perform any of a wide variety of functions, such as memory storage, data processing, and/or other suitable functions. Accordingly, representative systems 980 can include, without limitation, hand-held devices (e.g., mobile phones, tablets, digital readers, and digital audio players), computers, vehicles, appliances and other products. Components of the system 980 may be housed in a single unit or distributed over multiple, interconnected units (e.g., through a communications network). The components of the system 980 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the sectional transistor devices have been described in the context of CMOS devices. Transistor devices configured in accordance with other embodiments of the present technology, however, can include other types of suitable transistor types in addition to or in lieu of CMOS devices, such as, FET, MOSFET, or BJT devices, etc.

The term "processing" as used herein includes manipulating signals and data, such as writing or programming, reading, erasing, refreshing, adjusting or changing values, calculating results, executing instructions, assembling, transferring, and/or manipulating data structures. The term data structures includes information arranged as bits, words or code-words, blocks, files, input data, system generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 3-9.

I claim:
1. An apparatus, comprising:
    a first active region comprising a first current channel that extends along a first direction and includes a first source region;
    a second active region comprising a second current channel that extends along the first direction and includes a second source region, wherein:
        the second source region is physically separate from the first source region, and
        the second source region is aligned with the first source region; and
    a conductive structure extending across the first active region and the second active region along a second direction and electrically connecting the first and second source regions;
    wherein
    the first and second active regions have same dopants, and
    the first and second current channels are configured to be activated by a common gate signal.
2. The apparatus of claim 1, wherein the first current channel and the second current channel are electrically connected in parallel.
3. The apparatus of claim 1, wherein:
    the first active region includes a first group of current channels arranged along a first line extending along the first direction, wherein the first group of current channels includes the first channel;
    the second active region includes a second group of current channels arranged along a second line extending along the first direction,
        wherein the second group of current channels includes the second current channel; and
    the conductive structure includes a plurality of linear legs that extend across the first active region and the second active region, wherein each linear leg electrically connects source regions of a parallel pair of current channels in the first active region and the second active region.
4. The apparatus of claim 3, wherein:
    the conductive structure includes a second plurality of linear legs that extend across the first active region and the second active region and configured to communicate the common gate signal, wherein each leg in the second plurality of linear legs is adjacent to a corresponding linear leg that electrically connects the source regions.
5. The apparatus of claim 1, further comprising:
    an isolation mechanism between the first active region and the second active region, wherein the isolation mechanism physically separates the first current channel from the second current channel; and
    wherein:
    the conductive structure extends across the isolation mechanism.
6. The apparatus of claim 5, wherein the isolation mechanism is a shallow trench isolation (STI) mechanism.
7. The apparatus of claim 1, wherein:
    the first current channel has a first channel width; and
    the second current channel has a second channel width different than the first channel width.
8. The apparatus of claim 1, wherein the first current channel has a first channel width and the second current channel has a second channel width equal to the first channel width.
9. The apparatus of claim 1, wherein the first current channel has a first channel width and the second current channel has a second channel width, wherein a sum of the first channel width and the second channel width is a total channel width associated with a source-drain current level for the apparatus.

10. The apparatus of claim 1, further comprising:
a third active region including a third current channel, wherein the third current channel extends along the first direction and includes a third source region in the third active region, wherein:
the third active region is physically separate from the first active region and the second active region, and
the third current channel is parallel with the first current channel and the second current channel; and
wherein:
the conductive structure extends across the third active region and electrically connects matching source regions of the first, second and third current channels to one another.

11. The apparatus of claim 1, wherein the first active region, the second active region, and the conductive structure create a transistor device.

12. The apparatus of claim 11, wherein the transistor device is included in a data input buffer of a DRAM device.

13. The apparatus of claim 12, wherein the transistor device is included in an amplifier circuit in the data input buffer.

14. An apparatus, comprising:
a first active region comprising first, second and third doped regions that are arranged in a first direction relative to one another, the first and second doped regions cooperating with each other to define a first current channel, and the second and third doped regions cooperating with each other to define a second current channel;
a second active region comprising fourth, fifth and sixth doped regions arranged in the first direction relative to one another, the fourth and fifth doped regions cooperating with each other to define a third current channel, the fifth and sixth doped regions cooperating with each other to define a fourth current channel, the second active region being physically isolated from the first active region and arranged in a second direction relative to the first active region, the second direction being perpendicular to the first direction;
a gate electrode comprising first and second fingers, the first finger extending in the second direction over the first and third current channels, and the second finger extending in the second direction over the second and fourth current channels;
a first electrode comprising third and fourth fingers, the third finger extending in the second direction with electrical contact with the first and fourth doped regions, the second finger extending in the second direction with electrical contact with third and sixth doped regions; and
a second electrode comprising a fifth finger, the fifth finger extending in the second direction with electrical contact with the second and fifth doped regions.

15. The apparatus of claim 14,
wherein the first active region further comprises seventh and eighth doped regions arrange in the first direction, the third and seventh doped regions cooperating with each other to define a fifth current channel, and the seven and eighth doped regions cooperating with other to define a sixth current channel;
wherein the second active region further comprises ninth and tenth doped regions arrange in the first direction, the sixth and ninth doped regions cooperating with each other to define a seventh current channel, and the ninth and tenth doped regions cooperating with other to define a tenth current channel;
wherein the gate electrode further comprises sixth and seventh fingers, the sixth finger extending in the second direction over the fifth and seventh current channels, and the seventh finger extending in the second direction over the sixth and eighth current channels;
wherein the first electrode further comprises a ninth finger, the ninth finger extending in the second direction with electrical contact with the eighth and tenth doped regions; and
wherein the second electrode further comprises an eighth finger, the eighth finger extending in the second direction with electrical contact with seventh and ninth doped regions.

16. The apparatus of claim 14,
wherein each of the first and second current channels has a first channel width; and
wherein each of the third and fourth current channels has a second channel width that is substantially equal to the first channel width.

17. The apparatus of claim 14,
wherein each of the first and second current channels has a first channel width; and
wherein each of the third and fourth current channels has a second channel width that is different from the first channel width.

18. The apparatus of claim 14, wherein the second active region is isolated from the first active region by a trench isolation (STI).

19. The apparatus of claim 15, wherein the first electrode serves as a source electrode and the second electrode serves as a drain electrode.

* * * * *